United States Patent
Gurumurthy et al.

(10) Patent No.: US 9,331,680 B2
(45) Date of Patent: May 3, 2016

(54) LOW POWER CLOCK GATED FLIP-FLOPS

(71) Applicant: Texas Instruments Incorporated, Dallas, TX (US)

(72) Inventors: Girishankar Gurumurthy, Bangalore (IN); Mahesh Ramdas Vasishta, Bangalore, IN (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/481,992

(22) Filed: Sep. 10, 2014

(65) Prior Publication Data

US 2015/0070063 A1    Mar. 12, 2015

Related U.S. Application Data

(60) Provisional application No. 61/875,990, filed on Sep. 10, 2013.

(51) Int. Cl.
*H03K 3/356* (2006.01)
*H03K 3/3562* (2006.01)
*H03K 3/012* (2006.01)

(52) U.S. Cl.
CPC ............ *H03K 3/35625* (2013.01); *H03K 3/012* (2013.01)

(58) Field of Classification Search
None
See application file for complete search history.

(56) References Cited

U.S. PATENT DOCUMENTS

| | | | |
|---|---|---|---|
| 2006/0152268 A1* | 7/2006 | Flynn | H03K 3/0375 327/218 |
| 2013/0049836 A1* | 2/2013 | Yang | H03K 3/35625 327/203 |
| 2013/0173977 A1* | 7/2013 | Gurumurthy | H03K 3/35625 327/202 |

* cited by examiner

*Primary Examiner* — Long Nguyen
(74) *Attorney, Agent, or Firm* — John R. Pessetto; Charles A. Brill; Frank D. Cimino

(57) ABSTRACT

A flip-flop that includes a multiplexer configured to generate a multiplexer output. The multiplexer output is generated in response to an input and a scan enable, and is given to a transmission gate. A master latch is coupled to the transmission gate and to a tri-state inverter. The master latch is configured to receive an output of the transmission gate. A slave latch is configured to receive an output of the tri-state inverter and the multiplexer output. A data inverter is coupled to the slave latch. The data inverter is configured to generate a flip-flop output. A half clock gating inverter is configured to generate an inverted clock input in response to a clock input and the multiplexer output.

10 Claims, 6 Drawing Sheets

LOW POWER CLOCK GATED FLIP-FLOPS

CROSS REFERENCE TO RELATED APPLICATIONS

This application claims priority from U.S. provisional patent application No. 61/875,990 filed on Sep. 10, 2013, which is hereby incorporated by reference in its entirety.

TECHNICAL FIELD

Embodiments of the disclosure relate to low power clock gated flip-flops in an integrated circuit.

BACKGROUND

In modern integrated circuits (ICs), the flip-flops contribute to a substantial portion of any circuit design's power consumption. A comparison of the power consumption by the various units in an IC is as follows; logic implementation 29%, flip flops 27%, RAM 18%, clock tree 16% and the integrated clock gating (ICG) consumes 10% of the total power in a typical design. Therefore in an IC, the significant power consumption is due to tedious synchronization of the various clock phases and routing of the clock signals. The majority of power inside a flip flop is consumed by the transistors receiving the clock input, since the data activity factors are typically much lower. Irrespective of whether the data changes every cycle or not, the transistors receiving the clock input keep switching at every clock cycle. Thus, it is apparent that with reduced transistor switching, the power consumed by the flip-flop can also be reduced. Further, constant toggling of the clock input causes a significant amount of gate capacitances. It is apparent that with the reduction in the number gate capacitances, a considerable amount of power consumed by the flip-flop in the IC can be reduced.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides a flip-flop. The flip-flop includes a multiplexer configured to generate a multiplexer output. The multiplexer output is generated in response to an input and a scan enable, and is given to a transmission gate. A master latch is configured to receive an output of the transmission gate. A tri-state inverter is configured to receive an output of the master latch. A slave latch is configured to receive an output of the tri-state inverter and the multiplexer output. Further, a data inverter is coupled to the slave latch. The data inverter is configured to generate a flip-flop output. A half clock gating inverter is configured to generate an inverted clock input in response to a clock input and the multiplexer output.

Another example embodiment provides an apparatus. The apparatus includes a clock input and a plurality of flip-flops. The plurality of flip-flops is configured to receive the clock input. Each of the flip-flops includes a multiplexer configured to generate a multiplexer output. The multiplexer output is generated in response to an input and a scan enable, and is given to a transmission gate. A master latch is configured to receive an output of the transmission gate. A tri-state inverter is configured to receive an output of the master latch. A slave latch is configured to receive an output of the tri-state inverter and the multiplexer output. Further, a data inverter is coupled to the slave latch. The data inverter is configured to generate a flip-flop output. A half clock gating inverter is configured to generate an inverted clock input in response to a clock input and the multiplexer output. The half clock gating inverter includes a first PMOS and a first NMOS transistor, both of which are configured to receive the clock input at the gate terminal and generate the inverted clock input. A second PMOS transistor is coupled to a source of the first PMOS transistor; the second PMOS transistor is configured to be controlled by the multiplexer output. A second NMOS transistor is coupled to a node between the drains of the first PMOS transistor and the first NMOS transistor. The second NMOS transistor is configured to be controlled by the multiplexer output.

Another example embodiment provides a flip-flop. The flip-flop includes a multiplexer configured to generate a multiplexer output. An inverter is coupled to the multiplexer configured to generate an inverted multiplexer output. A master latch is configured to receive the multiplexer output and the inverted multiplexer output. The master latch includes a master clock pull-up circuit coupled to a master clock pull-down circuit. The slave latch is coupled to the master latch and is configured to receive a pair of complementary outputs from the master latch. The slave latch includes a slave clock pull-down circuit coupled to a slave clock pull-up circuit. The slave clock pull-up circuit configured to generate a slave latch output. A data inverter is configured to generate a flip-flop output in response to the slave latch output.

Another example of an embodiment provides an apparatus. The apparatus includes a clock input and a plurality of flip-flops configured to receive the clock input. Each of the plurality of flip-flops includes a multiplexer configured to generate a multiplexer output. An inverter is coupled to the multiplexer configured to generate an inverted multiplexer output. A master latch is configured to receive the multiplexer output and the inverted multiplexer output. The master latch includes a master clock pull-up circuit coupled to a master clock pull-down circuit. The slave latch is coupled to the master latch and is configured to receive a pair of complementary outputs the master latch. The slave latch includes a slave clock pull-down circuit coupled to a slave clock pull-up circuit. The slave clock pull-up circuit is configured to generate a slave latch output. A data inverter is configured to generate a flip-flop output in response to the slave latch output. The master clock pull-up circuit and the slave clock pull-down circuit are configured such that the flip-flop output is generated without inverting the clock input.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
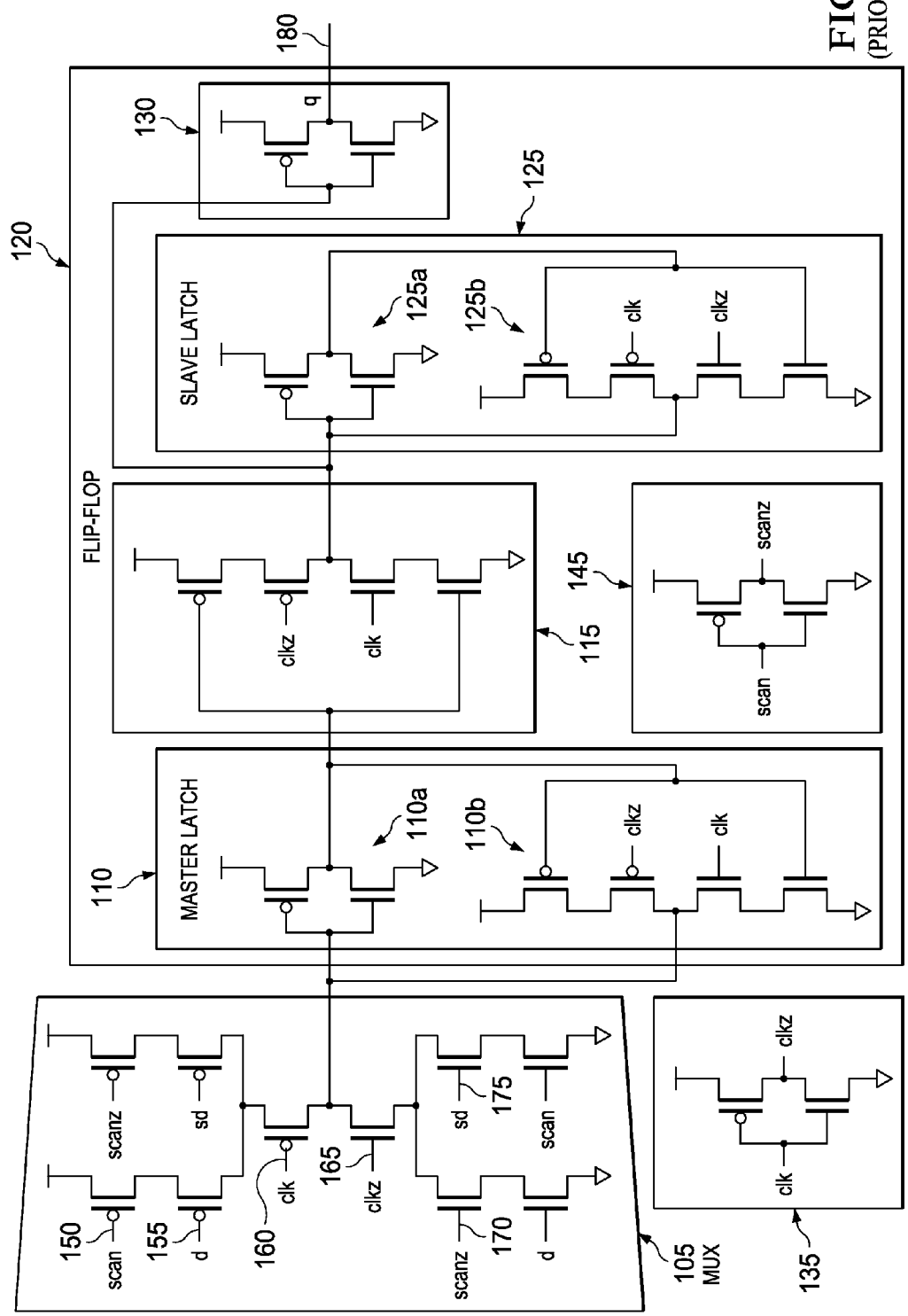
FIG. 1 illustrates a schematic of a flip-flop (prior art)

FIG. 1 illustrates a schematic of a flip-flop 100. The flip flop 100 includes a multiplexer 105. The multiplexer 105 receives a data input D 155, a scan data input SD 175, a scan enable SCAN 150, an inverted scan enable SCANZ 170, a clock input CLK 160 and an inverted clock input CLKZ 165. The multiplexer 105 is coupled to a master latch 110. The output of the master latch 110 is received at a tri-state inverter 115. A slave latch 125 is coupled to the tri-state inverter 115. The master latch 110 and the slave latch 125 are implemented using two back-to-back inverters. The back-to-back inverters include an inverter 110a and a tri-state inverter 110b in the master latch and an inverter 125a and a tri-state inverter 125b in the slave latch. An output of the slave latch 125 is received at a data inverter 130. The data inverter 130 generates a flip-flop output 180. An inverter 135 receives the clock input CLK 160 to generate the inverted clock input CLKZ 165. An inverter 145 receives the scan enable SCAN 150 to generate an inverted scan enable SCANZ 170.

The operation of the flip-flop illustrated in FIG. 1 is explained now. The flip-flop 100 is implemented using MOS transistors. The multiplexer 105 selects either the data input D 155 or the scan data input SD 175 in response to the scan enable SCAN 150. The data input 155 or the scan data input SD 175 is stored using the master latch 110 coupled to the tri-state inverter 115 and the slave latch 125. The output of the slave latch 125 is inverted by the data inverter 130 to generate the flip-flop output Q 180. The majority of power inside the flip flop 100 is consumed by the transistors receiving the clock input 160 and the inverted clock input 165. Irrespective of whether there is a change in either the data input 155 or the scan data input 175 the transistors receiving the clock input 160 and the inverted clock input 165 switch at every clock cycle. In the flip-flop 100, the clock input 160 and the inverted clock input 165 are received at the multiplexer 105, the tri-state inverter 110b of the master latch 110, the tri-state inverter 115 and the tri-state inverter 125b of the slave latch. Therefore, there are a total of 10 transistors that receive either the clock input 160 or the inverted clock input 165. It is apparent that with reduced switching at the transistors, the power consumed by the flip-flop 100 can also be reduced. Further, the constant toggling of the clock input 160 and the inverted clock input 165 introduces a significant amount of gate coupling. With the reduction in the amount of gate coupling, a considerable amount of power consumed by the flip-flop 100 can be reduced. In addition to the power loss, if only one inverter is used to invert the clock input 160 in an IC the plurality of the flip-flops 100 must be arranged in a vector. Hence, the flip-flops 100 must be aligned with respect to the clock input 160, resulting in a power efficient design.

Figure 2:
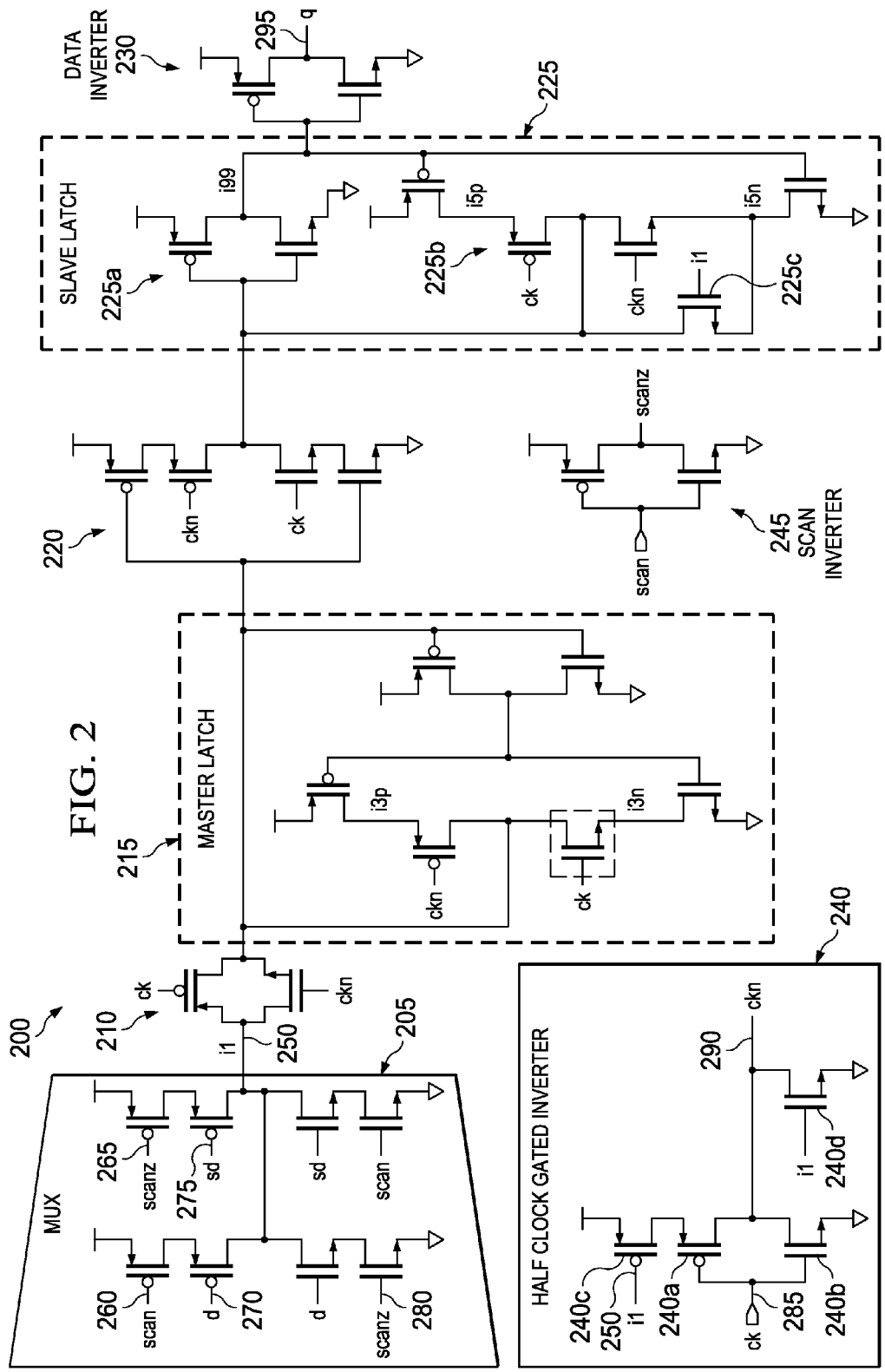
FIG. 2 illustrates a schematic of a transistor level implementation of a flip-flop according to an embodiment.

FIG. 2 illustrates a schematic of a transistor level implementation of a flip-flop 200, according to an embodiment. The flip-flop 200 is implemented using PMOS and NMOS transistors. The flip-flop 200 includes a multiplexer 205 which is configured to generate a multiplexer output 250. The multiplexer output 250 is generated in response to an input (data input 270 or scan data input 275) and a scan enable 260 and given to a transmission gate 210. A master latch 215 is configured to receive an output of the transmission gate 210. A tri-state inverter 220 is configured to receive an output of the master latch 215. A slave latch 225 is configured to receive an output of the tri-state inverter 220 and the multiplexer output 250. A data inverter 230 is coupled to the slave latch 225. The data inverter 230 is configured to generate a flip-flop output 295. The flip-flop output 295 is a data output when scan enable 260 is disabled and a scan data output when scan enable 260 is enabled.

The flip-flop 200 further includes a half clock gating inverter 240. The half clock gating inverter 240 is configured to generate an inverted clock input 290 in response to a clock input 285 and the multiplexer output 250. The half clock gating inverter 240 is implemented using an inverter having a first PMOS transistor 240a and a first NMOS transistor 240b, receiving the clock input 285 to generate the inverted clock input 290. A second PMOS transistor 240c is coupled to a source of the first PMOS transistor 240a. A gate of the second PMOS transistor 240c is configured to be controlled by the multiplexer output 250. The half clock gating inverter 240 further includes a second NMOS transistor 240d coupled to a node between the drains of the first PMOS transistor 240a and the first NMOS transistor 240b. A gate of the second NMOS transistor 240d is configured to be controlled by the multiplexer output 250.

The operation of the flip-flop 200 illustrated in FIG. 2 is explained now. In the flip-flop 200, the multiplexer 205 receives the data input 270, the scan data input 275, a scan enable 260 and an inverted scan enable 265 and selects one of the data input 270 and the scan data input 275 in response to the scan enable 260. The scan enable 260 is inverted using a scan inverter 245 to generate the inverted scan enable 265. The multiplexer output 250 is received at the transmission gate 210. The multiplexer 205 generates the multiplexer output 250 which is then stored in the master latch 215 using a first plurality of back-to-back inverters. Each of the first plurality of back-to-back inverters includes an inverter coupled to a tri-state inverter. The multiplexer output 250 is then inverted using the tri-state inverter 220. The slave latch 225 coupled to the tri-state inverter 220 includes a second plurality of back-to-back connected inverters. Each of the second plurality of back-to-back connected inverters includes a first inverter 225a coupled to a second tri-state inverter 225b. The first inverter 225a of the second plurality of back-to-back connected inverters is configured to generate an output to the data inverter 230. A third NMOS transistor 225c is coupled in parallel to an NMOS transistor of the second tri-state inverter 225b. A gate of the third NMOS transistor 225c receives the multiplexer output 250 and a gate of the NMOS transistor of the second tri-state inverter 225b is configured to receive the inverted clock input 290. When the multiplexer output 250 is logic '0', the third NMOS transistor 225c of the slave latch 225 is inactivated. It is noted that the flip-flop output 295 is generated in the same manner as explained for the flip-flop 100 illustrated in FIG. 1. Further, when the multiplexer output 250 is logic '0', the half clock gating inverter 240 generates the inverted clock input 290 as the second PMOS transistor 240c is activated and the second NMOS transistor 240d is inactivated.

The flip-flop 200 is in a power save mode when the multiplexer output 250 is logic '1'. The multiplexer output 250 is logic '1' when the input (data input 270 or scan data input 275) is logic '0'. When the multiplexer output is logic '1', the second PMOS transistor 240c of the half clock gated inverter 240 is inactivated and the second NMOS transistor 240d is activated, thereby the inverted clock input 290 is tied to logic '0' irrespective of the state of the clock input 285. Further, when the clock input 285 is logic '0' the NMOS transistor of the second tri-state inverter 225b in the slave latch 225 is inactivated as the inverted clock input 290 is tied to logic '0'. The slave latch 225 stores the multiplexer output 250 using the third NMOS transistor 225c coupled in parallel to the NMOS transistor of the second tri-state inverter 225b. When the multiplexer output 250 is logic '1', the number of transistors that receive constantly toggling inverted clock input 290 is reduced from 10 transistors seen in flip-flop 100 to 6 transistors in flip-flop 200. The flip-flop 200 utilizes only 3 more transistors compared to flip-flop 100. Therefore, the flip-flop 200 is a low-area overhead solution that reduces the power consumed by the transistors that receive the inverted clock input 290.

Figure 3:
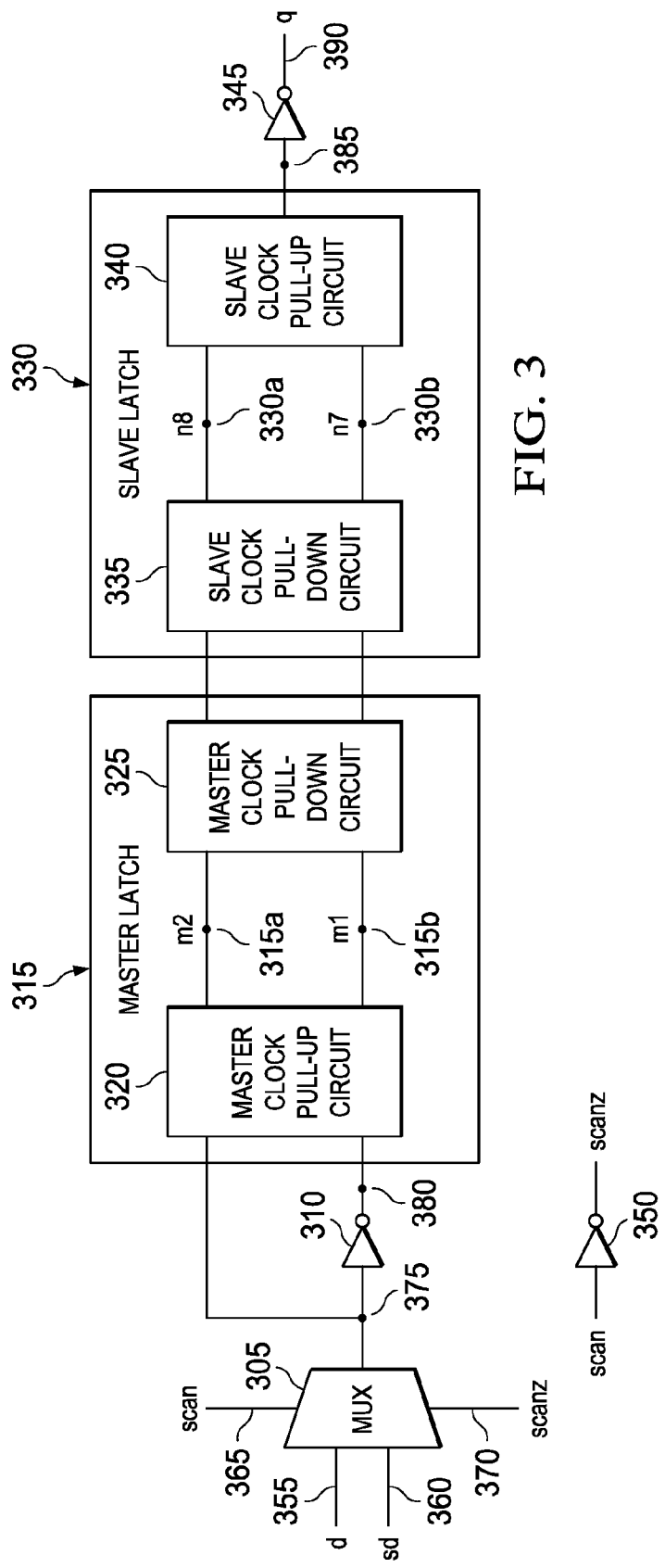
FIG. 3 illustrates a schematic of a flip-flop according to an embodiment.

FIG. 3 illustrates a schematic of a flip-flop 300 according to an embodiment. The flip-flop 300 is implemented using PMOS and NMOS transistors. The flip-flop 300 includes a multiplexer 305 configured to generate a multiplexer output 375. An inverter 310 is coupled to the multiplexer 305 configured to generate an inverted multiplexer output 380. A master latch 315 is configured to receive the multiplexer output 375 and the inverted multiplexer output 380. The master latch 315 includes a master clock pull-up circuit 320 coupled to a master clock pull-down circuit 325. A slave latch 330 is coupled to the master latch 315 and is configured to receive a pair of complementary outputs from the master latch 315. The slave latch 330 includes a slave clock pull-down circuit 335 coupled to a slave clock pull-up circuit 340. The slave clock pull-up circuit 340 is configured to generate a slave latch output 385. A data inverter 345 is configured to generate a flip-flop output 390 in response to the slave latch output 385.

The operation of the flip-flop 300 illustrated in FIG. 3 is explained now. The multiplexer 305 receives a data input 355, a scan data input 360, a scan enable 365 and an inverted scan enable 370 and selects one of the data input 355 and the scan data input 360 in response to the scan enable 365. The multiplexer output 375 is received at the inverter 310 and the inverted multiplexer output 380 is generated. The master latch 315 receives both the multiplexer output 375 and the inverted multiplexer output 380 at the master clock-pull up circuit 320. The master clock pull-up circuit 320 generates a master first output (m2) 315a and a master second output (m1) 315b and is responsible for the implementation of the clock pull-up function in the master latch 315. The master clock pull-down circuit 325 receives the master first output 315a and the master second output 315b. The master clock pull-down circuit 325 is responsible for generating the pair of complementary outputs which are then received at the slave latch 330 at the slave pull-down circuit 335. The slave clock pull-down circuit 335 generates a slave first output (n8) 330a and a slave second output (n7) 330b and is responsible for the implementation of the clock pull-down function in the slave latch 330. The slave clock pull-up circuit 340 receives the slave first output 330a and the slave second output 330b to generate the slave latch output 385. The slave latch output 385 is inverted by the data inverter 345 to generate the flip-flop output 390.

Figure 4:
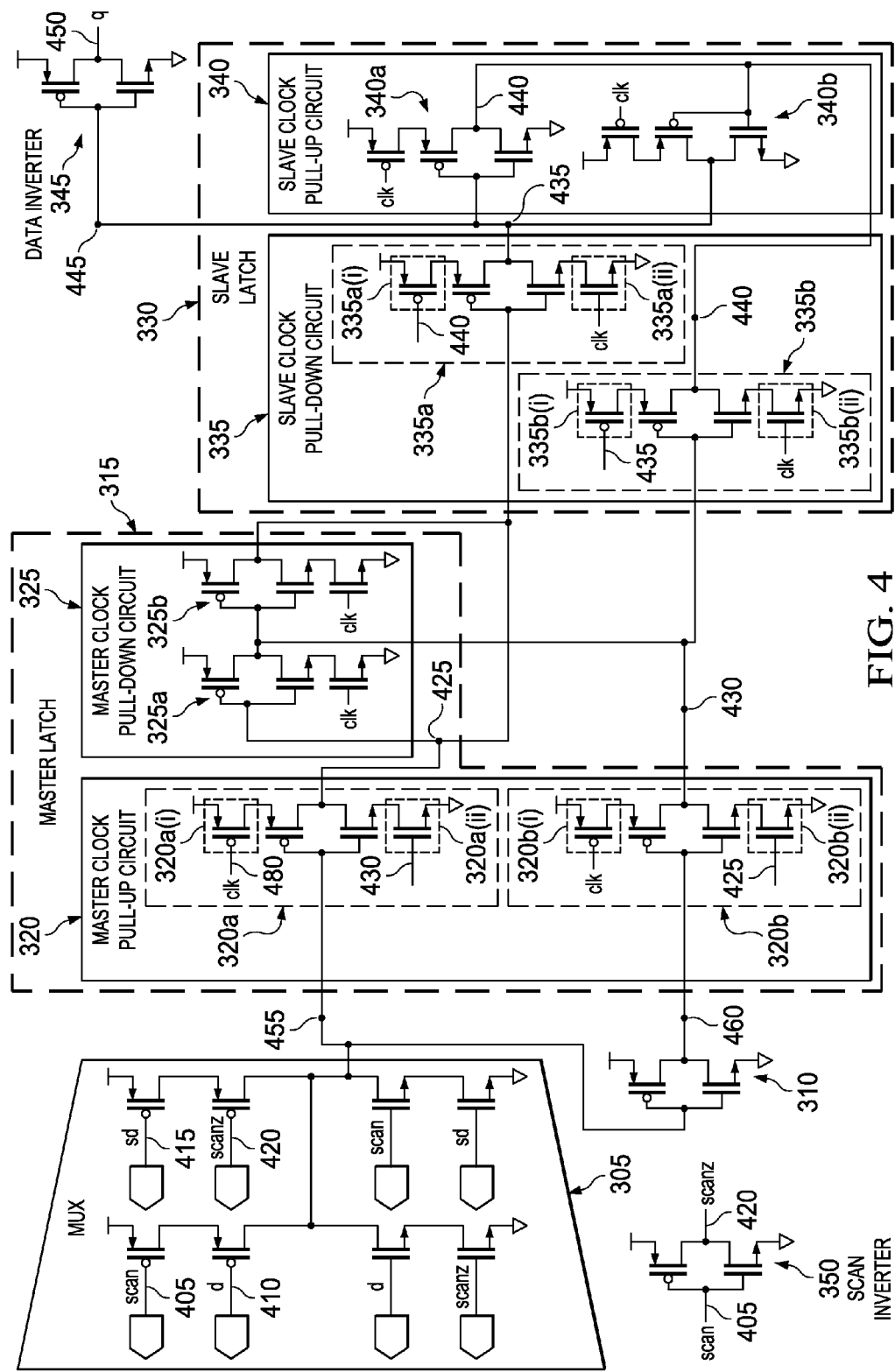
FIG. 4 illustrates a schematic of a transistor level implementation of a flip-flop of FIG. 3.

FIG. 4 illustrates a schematic of a transistor level implementation of a flip-flop 300 of FIG. 3. The flip-flop 400 is analogous to flip-flop 300 described in FIG. 3 in both connections and operations. The master clock pull-up circuit 320 includes a first tri-state inverter 320a and a second tri-state inverter 320b. The first tri-state inverter 320a is configured to receive the multiplexer output 455 and in turn generates the master first output 425 to the master clock pull-down circuit 325. Conventionally, a tri-state inverter can be implemented using an inverter coupled to a transmission gate, therefore the first tri-state inverter 320a can be implemented as an inverter coupled to a transmission gate. A PMOS transistor 320a (i) of the transmission gate is configured to receive the clock input 480 and an NMOS transistor 320a (ii) of the transmission gate is configured to receive the master second output 430 of the master clock pull-up circuit 320. The second tri-state inverter 320b is configured to receive the inverted multiplexer output 460 and in turn generates the master second output 430 to the master clock pull-down circuit 325. The second tri-state inverter 320b can be further implemented using an inverter coupled to a transmission gate. A PMOS transistor 320b (i) of the transmission gate is configured to receive the clock input 480 and an NMOS transistor 320b (ii) of the transmission gate is configured to receive the master first output 425. The master clock pull-down circuit 325 receives the master first output 425 and the master second output 430. The master clock pull-down circuit 325 includes a first NMOS tri-stated inverter 325a and a second NMOS tri-stated inverter 325b. The first NMOS tri-stated inverter 325a generates a first output in response to the master first output 425. The second NMOS tri-stated inverter 325b generates a second output in response to the master second output 430. The first output and the second output are complementary to each other.

The first output and the second output from the master latch 315 are then received at the slave latch 330 at the slave pull-down circuit 335. The slave pull-down circuit 335 includes a first tri-state inverter 335a and a second tri-state inverter 335b. The first tri-state inverter 335a is configured to receive the second output from the master latch and in turn generates the slave first output 435 to the slave clock pull-up circuit 340. The first tri-state inverter 335a is implemented as an inverter coupled to a transmission gate. A PMOS transistor 335a(i) of the transmission gate is configured to receive the slave second output 440 and an NMOS transistor 335a(ii) of the transmission gate is configured to receive the clock input 480. The second tri-state inverter 335b is configured to receive the first output from the master latch and in turn generates the slave second output 440 to the slave clock pull-up circuit 340. The second tri-state inverter 335b can be further implemented using an inverter coupled to a transmission gate. A PMOS transistor 335b(i) of the transmission gate is configured to receive the slave first output 435 and an NMOS transistor 335b(ii) of the transmission gate is configured to receive the clock input 480. The slave clock pull-up circuit 340 receives the slave first output 435 and the slave second output 440 to generate the slave latch output 445. The slave clock pull-up circuit 340 includes a first PMOS tri-stated inverter 340a and a second PMOS tri-stated inverter 340b. The first PMOS tri-stated inverter 340a receives the slave first output 435 of the slave clock pull-down circuit 335 and is configured to generate an output. The second PMOS tri-stated inverter 340b is configured to generate the slave latch output 445 in response to the output generated by the first PMOS tri-stated inverter 340a.

The operation of the flip-flop 400 illustrated in FIG. 4 is explained now. The multiplexer 305 selects either the data input 410 or the scan data input 415 in response to the scan enable 405. The multiplexer output 455 is inverted by the inverter 310 to generate the inverted multiplexer output 460. The master latch 315 receives the multiplexer output 455 and the inverted multiplexer output 460 and it is configured to generate the first output and the second output which are received at the slave latch 330. The first output and the second output are complementary to each other. The master latch 315 and slave latch 330 are configured such that, there is no need of inverted clock input. The master clock pull-up circuit 320 receives the clock input 480 at the PMOS transistors (320a(i) and 320b(i)) of the transmission gates of the first tri-state inverter 320a and the second tri-state inverter 320b. In the slave latch 330, the clock input 480 is received at the NMOS transistors (335a (ii) and 335b (ii)) of the transmission gates of the first tri-state inverter 335a and the second tri-state inverter 335b. Thus, the inversion function is achieved by combination of the master clock pull-up circuit 320 and the slave pull-down circuit 335. To maintain the robustness of the flip-flop 400, a jam-latch' scenario is avoided. In other words the master latch 315 can be implemented using two back-to-back inverters, but in the flip-flop 400, an input (the data input 410 and the scan data input 415) is tri-stated with clock input 480 on the NMOS tri-stated inverters 325a and 325b. The NMOS tri-stated inverters 325a and 325b are used in order to avoid a conflict in logic of the input (data input 410 or scan data input 415) that is being written into the master latch 315. Similarly, in the slave latch 330 the PMOS tri-stated inverters 340a and 340b are used in order to avoid a conflict in logic of the input (data input 410 or scan data input 415) that is being written into the slave latch 330. Therefore, instead of using two back-to-back inverters, the master latch 315 and slave latch 330 receive complementary inputs and the complementary inputs are tri-stated using NMOS tri-stated inverters 325a and 325b and PMOS tri-stated inverters 340a and 340b, respectively. The complementary inputs are generated using the multiplexer 305 and inverter 310 at the master latch 315. The second set of complementary inputs is generated by the master clock pull-down circuit 325 which is received by the slave latch 330.

In several embodiments, the flip-flop 400 avoids the usage of an inverter to invert the clock input 480, thereby reducing the power consumed by the toggling clock input. By eliminating the inverter, the flip-flop 400 is able to reduce the inverter short-circuit power loss. The need to align the flip-flop 400 to the clock input 480 no longer exists as in the case of flip-flop 100. Further, the number of transistors that receive a constantly toggling signal is reduced from 10 transistors in flip-flop 100 to 8 transistors, thus eliminating the associated gate capacitances. The master latch 315 and slave latch 330 of the flip-flop 400 are not configured as jam-latches, hence the robustness of the flip-flop 400 is not compromised. In the flip-flop 400 greater transistor-stacking is achieved thereby resulting in significant savings in the leakage power as compared to the flip-flop 100. As the flip-flop 300 is analogous to flip-flop 400 in connections and operations, the advantages discussed above apply to the flip-flop 300.

Figure 5:
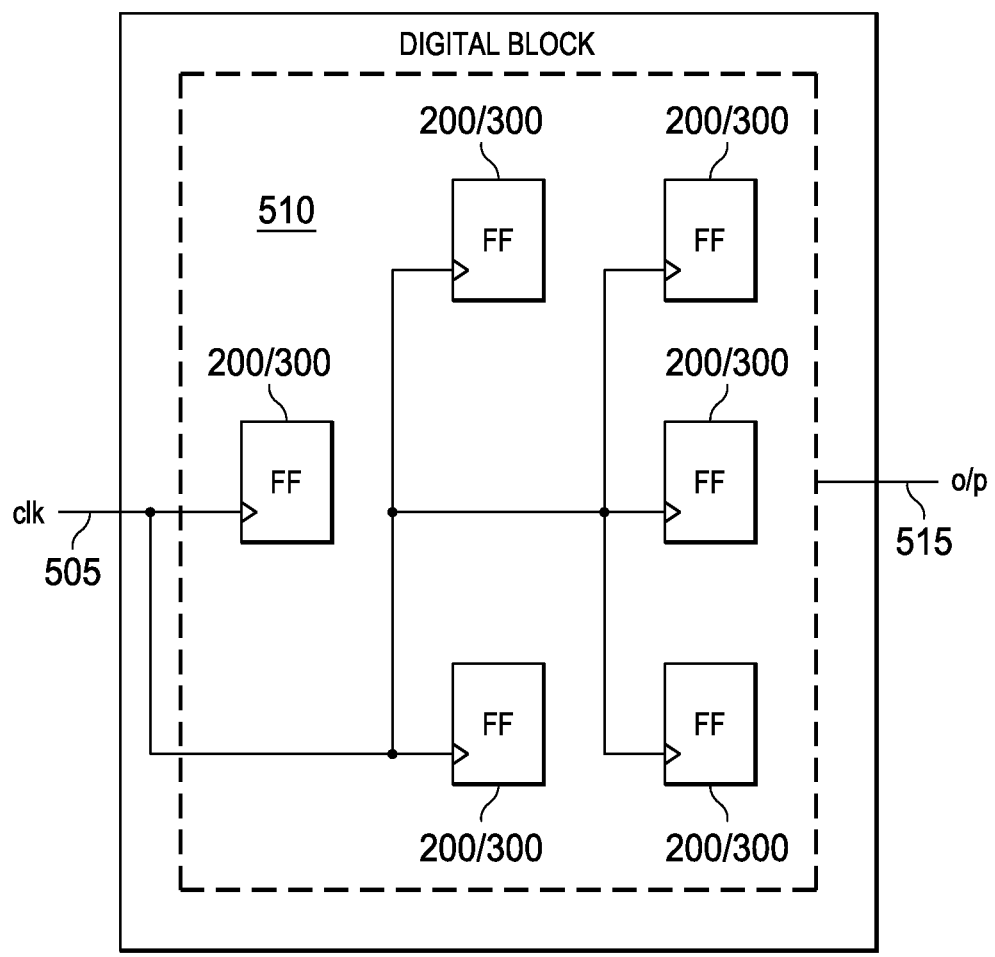
FIG. 5 illustrates schematic of an apparatus using flip-flops according to an embodiment.

FIG. 5 illustrates schematic of an apparatus using flip-flop 200 or flip flop 400 according to the embodiment. The apparatus 500 includes a clock input 505 and a plurality of flip-flops 510. Each of the flip-flops of the plurality of flip-flops 510 is configured to receive the clock input 505. Each flip-flop of the plurality of flip-flops 510 are analogous to flip-flop 200 or flip-flop 400 described in FIG. 2 and FIG. 4 respectively, in both connections and operations and thereby not repeated for the sake of simplicity. The flip-flops in the plurality of flip-flops 510 are configured to perform a combinational logic. An output 515 is generated at an output of the plurality of flip-flops 510.

The apparatus 500 includes the large numbers of instantiated scan flip-flops 200, hence with reduced transistor switching, the power consumed by the apparatus 500 can be significantly reduced. By eliminating an inverter (compared to a conventional apparatus) to invert the clock input 480, the flip-flop 400 is able to reduce the inverter short-circuit power loss. The need to align the flip-flop 400 to the clock input 480 no longer exists as in the case of flip-flop 100. Further the number of transistors that receive a constantly toggling signal is reduced from 10 transistors in flip-flop 100 to 8 transistors, thus eliminating the associated gate capacitances. In the flip-flop 400 greater transistor-stacking is achieved thereby resulting in significant savings in the leakage power as compared to the flip-flop 100. Hence, with the reduction in the number gate capacitances, leakage power and inverter short-circuit power loss, in each of the plurality of flip-flops 510, a considerable amount of power is saved in the apparatus 500.

Figure 6:
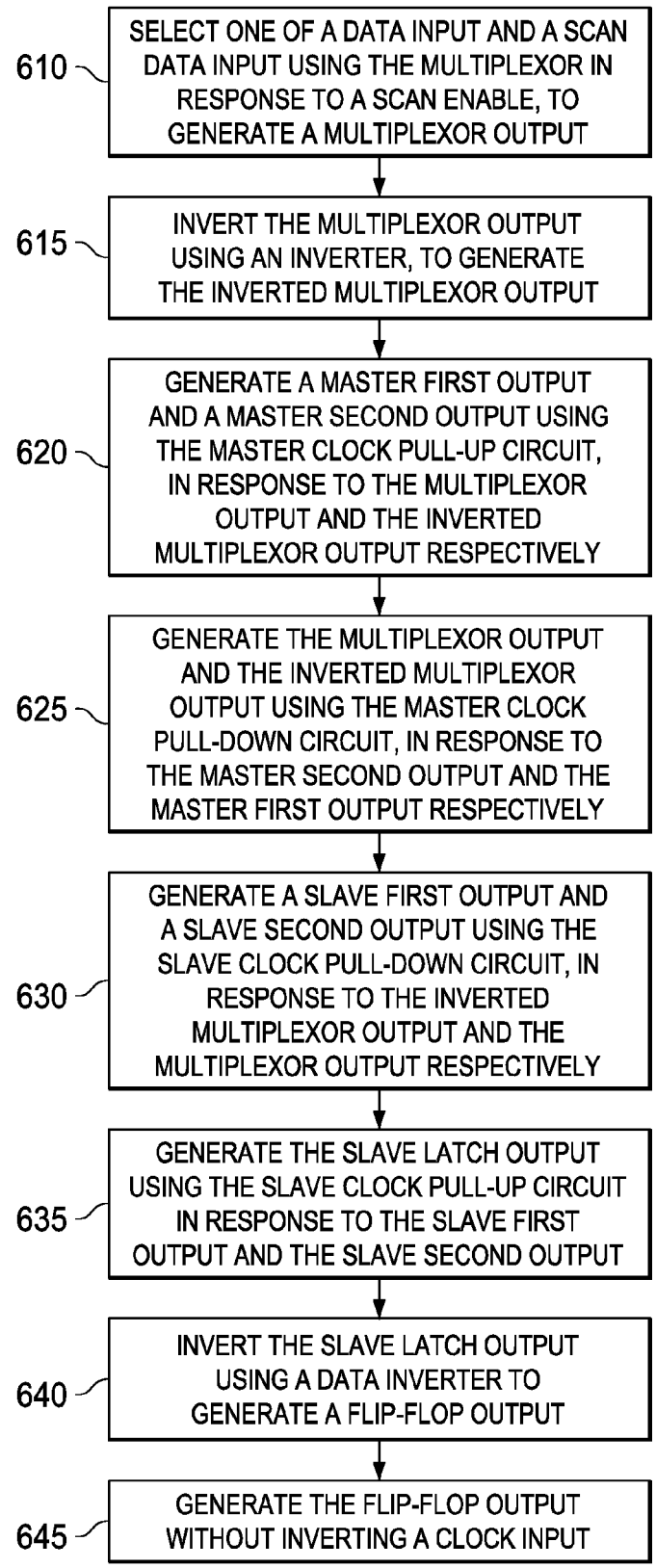
FIG. 6 is a flowchart illustrating a method of generating a flip-flop output according to an embodiment.

FIG. 6 is a flowchart 600 illustrating a method of generating a flip-flop output 450 of a flip-flop 400, according to an embodiment. The flip-flop 400 includes a multiplexer 305 and an inverter 310 coupled to the multiplexer 305. The master latch 315 receives the multiplexer output 455 and the inverted multiplexer output 460. The master latch 315 includes a master clock pull-up circuit 320 coupled to a master clock pull-down circuit 325. A slave latch 330 is coupled to the master latch 315. The slave latch 330 includes a slave clock pull-down circuit 335 coupled to a slave clock pull-up circuit 340 which generate a slave latch output 445. A data inverter 345 is configured to generate a flip-flop output 450 in response to the slave latch output 445.

At step 610, the multiplexer 305 selects one of a data input 410 and a scan data input 415, in response to a scan enable 415 to generate the multiplexer output 455. At step 615, the multiplexer output 455 is inverted by the inverter 310 to generate the inverted multiplexer output 460. A master latch 315 is configured to receive a multiplexer output 455 and an inverted multiplexer output 460 from the multiplexer 305 and the inverter 310 respectively. At step 620, the first output and the second output generated by the master latch 315 are received at the slave latch 330. The slave latch output 445 is generated using the slave clock pull-down circuit 335 coupled to the slave clock pull-up circuit 340, at step 625. At step 630, the slave latch output 445 is inverted by the data inverter 345 to generate the flip-flop output 450. At step 635, the flip-flop output 450 is generated without inverting the clock input 480. The inversion of the clock input 480 is implemented through the steps 620 and 625, as the clock input 480 pull-up is generated in step 620 and the clock input 480 pull-down is generated in step 625.

The aforementioned method discloses a process of generating the flip-flop output 450 without using a separate inverter to invert the clock input 480. By eliminating the inverter to invert the clock input 480, the flip-flop 400 is able to reduce the inverter short-circuit power loss. The method eliminates the need to align the flip-flop 400 to the clock input 480 as in the case of flip-flop 100. Further, the method describes steps to reduce the number of transistors that receive a constantly toggling signal, from 10 transistors in flip-flop 100 to 8 transistors, thus eliminating the associated gate capacitances. By following the steps described in flowchart 600 greater transistor-stacking is achieved that results in significant savings in the leakage power as compared to the flip-flop 100. Thus a reduction in the number gate capacitances, leakage power and inverter short-circuit power loss is achieved.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic state "1," and the term "low" is generally intended to describe a signal that is at logic state "0." The term "on" applied to a transistor or group of transistors is generally intended to describe gate biasing to enable current flow through the transistor or transistors.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A flip-flop comprising:
a multiplexer configured to generate a multiplexer output to a transmission gate, in response to at least one input and a scan enable;
a master latch configured to receive an output of the transmission gate;
a tri-state inverter configured to receive an output of the master latch;
a slave latch configured to receive an output of the tri-state inverter and the multiplexer output;
a data inverter coupled to an output of the slave latch, configured to generate a flip-flop output; and
a half clock gating inverter configured to generate an inverted clock input in response to a clock input and the multiplexer output.

2. The flip-flop of claim 1, wherein the half clock gating inverter comprises:
an inverter having a first PMOS transistor and a first NMOS transistor, receiving the clock input to generate the inverted clock input;
a second PMOS transistor coupled to a source of the first PMOS transistor, a gate of the second PMOS transistor configured to be controlled by the multiplexer output; and
a second NMOS transistor coupled to a node between the drains of the first PMOS transistor and the first NMOS transistor, a gate of the second NMOS transistor configured to be controlled by the multiplexer output.

3. The flip-flop of claim 2, wherein:
the second PMOS transistor is activated and the second NMOS transistor is inactivated when the multiplexer output is logic '0', thereby generating the inverted clock input; and
the second PMOS transistor is inactivated and the second NMOS transistor is activated when the multiplexer output is logic '1', thereby tying the inverted clock input to logic '0'.

4. The flip-flop of claim 1, wherein the at least one input comprises a data input and a scan data input; and wherein, the multiplexer receives the data input, the scan data input, the scan enable and an inverted scan enable and is configured to select one of the data input and the scan data input in response to the scan enable.

5. The flip-flop of claim 1, wherein the master latch comprises a first plurality of back-to-back connected inverters and wherein, the first plurality of back-to-back connected inverters comprises an inverter coupled to a tri-state inverter.

6. The flip-flop of claim 1, wherein:
the slave latch comprises a second plurality of back-to-back connected inverters, wherein the second plurality of back-to-back connected inverters comprises a first inverter coupled to a second tri-state inverter;
the first inverter of the second plurality of back-to-back connected inverter is configured to generate an output to the data inverter; and
a third NMOS transistor coupled in parallel to an NMOS transistor of the second tri-state inverter, a gate of the third NMOS transistor receiving the multiplexer output, a gate of the NMOS transistor of the second tri-state inverter configured to receive the inverted clock.

7. The flip-flop of claim 6, wherein in the slave latch:
the third NMOS transistor is inactivated when the multiplexer output is logic '0'; and
the third NMOS transistor of the slave latch is configured to store the multiplexer output when the data input is logic '0' and the clock input is logic '0'.

8. The flip-flop of claim 1, wherein:
a data output is generated at the flip-flop output in a data state when the scan enable is logic '0'; and
a scan data output is generated at the flip-flop output in a scan state when the scan enable is logic '1'.

9. The flip-flop of claim 1, further comprising:
a scan inverter, configured to receive the scan enable to generate the inverted scan enable.

10. An apparatus comprising:
a clock input;
a plurality of flip-flops configured to receive the clock input; wherein each of the flip-flops comprises:
a multiplexer configured to generate a multiplexer output to a transmission gate, in response to an input and a scan enable;
a master latch configured to receive an output of the transmission gate;
a tri-state inverter configured to receive an output of the master latch;
a slave latch configured to receive an output of the tri-state inverter and the multiplexer output;
a data inverter coupled to an output of the slave latch, configured to generate a flip-flop output; and
a half clock gating inverter configured to generate an inverted clock input in response to the clock input and the multiplexer output; wherein the half clock gating inverter comprises:
a first PMOS and a first NMOS transistor, both configured to receive the clock input at gate terminal and configured to generate the inverted clock input;
a second PMOS transistor coupled to a source of the first PMOS transistor, the second PMOS transistor configured to be controlled by the multiplexer output; and
a second NMOS transistor coupled to a node between the drains of the first PMOS transistor and the first NMOS transistor, the second NMOS transistor configured to be controlled by the multiplexer output.

* * * * *